United States Patent [19]
Yamada

[11] Patent Number: 5,470,792
[45] Date of Patent: Nov. 28, 1995

[54] METHOD OF MANUFACTURING SEMICONDUCTOR DEVICE

[75] Inventor: Yoshiaki Yamada, Tokyo, Japan

[73] Assignee: NEC Corporation, Tokyo, Japan

[21] Appl. No.: 205,902

[22] Filed: Mar. 2, 1994

[30] Foreign Application Priority Data

Mar. 3, 1993 [JP] Japan ................................ 5-041617

[51] Int. Cl.$^6$ ........................................... H01L 21/44
[52] U.S. Cl. .................... 437/155; 437/152; 437/154; 437/203
[58] Field of Search ..................... 437/192, 194, 437/195, 203, 173, 174, 228, 189, 190, 197, 200

[56] References Cited

U.S. PATENT DOCUMENTS

| | | | |
|---|---|---|---|
| 4,758,533 | 7/1988 | Magee et al. | 437/174 |
| 4,968,643 | 11/1990 | Mukai | 437/174 |
| 5,104,826 | 4/1992 | Fujita et al. | 437/192 |
| 5,110,759 | 5/1992 | Mukai | 437/173 |
| 5,169,800 | 12/1992 | Kobayashi | 437/173 |
| 5,240,879 | 8/1993 | De Bruin | 437/192 |
| 5,266,526 | 11/1993 | Aoyama et al. | 437/192 |
| 5,288,664 | 2/1994 | Mukai | 437/173 |

OTHER PUBLICATIONS

Park, C. S., et al, "Contact Filling by Post-Annealing After Al Deposition", Proceedings of the 38th Spring Applied Physics Association, 1991, p. 731, 31p-W-7.

"Metal Plug Formation by Excimer Laser Irradiation for Submicron-Size Via Filling", Proceedings of the 38th Spring Applied Physics Association, 1991, p. 692, 30p-W-9,10,11.

Ono, Hisako, et al, "Development of a Planarized Al-Si Contact Filling Technology", Proceedings of the 7th VLSI Multilevel Interconnection Conference 1990, pp. 76-82.

Wilson, R. H., et al, "Highly Selective, High Rate Tungsten Deposition", 1985 Workshop, pp. 35-42.

Woratschek, B., et al, "Time Resolved Reflectivity Measurements of Al Alloys During Excimer Laser Planarization", Proceedings of the 7th VLSI Multilevel Interconnection Conference 1990, pp. 83-89.

*Primary Examiner*—Kevin M. Picardat

[57] ABSTRACT

Tungsten is grown only within a viahole 10. The upper surface of the tungsten layer 3 is made lower than the upper surface of a silicon oxide film 2. Thereafter, a titanium film 4 and a titanium nitride film 5 are formed by sputtering, and an aluminum alloy film 6 is formed by the sputtering while a silicon substrate 1 is heated to the temperature of 400 through 550 degrees Centigrade. Since the thickness of the tungsten layer 3 is thinner than the depth of the viahole 10, the upper layer wiring cannot be shorted by the tungsten layer 3. Further, since the viahole which remains not completely filled by the tungsten is completely filled with the tungsten layer 3 and the aluminum alloy film 6, no wire disconnection cannot occur in the viahole 10.

39 Claims, 4 Drawing Sheets

METHOD OF MANUFACTURING SEMICONDUCTOR DEVICE

FILED OF THE INVENTION

The present invention relates to a method of manufacturing a semiconductor device and, in particular, to a method of manufacturing a semiconductor device in which a hole is provided at an interlayer insulating film on a semiconductor substrate for embedding an electrically conductive material to perform an electrical connection between the upper and lower sides of the insulating film. More particularly, the present invention relates to the method comprising a step of embedding a high melting point metal into the hole provided through the insulating film, the hole reaching an electrically conductive element of the semiconductor substrate or a lower layer wiring.

BACKGROUND OF THE INVENTION

With the high level of integration of semiconductor devices, the hole provided at the interlayer insulating film, which reaches the semiconductor substrate or the lower layer wiring, has been made smaller. The hole is hereinafter referred to as a viahole. Meanwhile, the viahole tends to be deepened, and therefore, according to the normal sputtering which has been utilized for forming the electrode, the deposition rate of the wiring metallic film at the viahole has been low readily causing disconnection of the wire at the viahole.

In consequence, various methods have been proposed in order to solve the foregoing problem. First, as the method of embedding the aluminum alloy film into the viahole by the sputtering process, a bias sputtering method is widely known in which a negative bias is applied to the substrate during the sputtering. This method can embed the aluminum alloy film into the viahole by applying a negative voltage or a high frequency power to the substrate during formation of the aluminum alloy film by sputtering so as to etch the aluminum alloy film to flatten the surface thereof and to cause damage to the aluminum alloy by the plasma impact for fluidization of the alloy. In this case, since argon, which is the sputtering gas, is brought into the film due to the negative voltage applied during the sputtering on the substrate, the quality of the aluminum alloy film can be degraded due to the tendency of durability against electromigration to become lowered and of hillocks to or the like to be formed. Thus some methods are proposed in which, instead of applying the negative bias to the substrate, the aluminum alloy is fluidized only by heat to embed into the via hole.

One is a method of fluidizing the aluminum alloy for embedding by forming the aluminum alloy film by the sputtering process with the substrate heated to the high temperature of 400 to 550 degrees Centigrade, which is disclosed in Proceedings of the 7th VLSI Multilevel Interconnection Conference 1990, pp 76 through 82.

Secondly, there is a method in which after the aluminum alloy film is formed by the normal sputtering it is heated at the temperature of 450 through 600 degrees Centigrade without being exposed to the atmosphere to fluidize the aluminum alloy to embed into the viahole. This method is disclosed in, for example, Proceedings of the 38th Spring Applied Physics Association 1991, page 731, 31p-W-7.

The third one is a method in which after the aluminum alloy film is formed by the sputtering process the aluminum alloy is irradiated with an excimer laser beam to melt or fluidize the aluminum alloy to embed into the viahole, which is disclosed in, for example, Proceedings of the 7th VLSI Multilevel Interconnection Conference 1990, pp 83 through 89.

Figure 1:
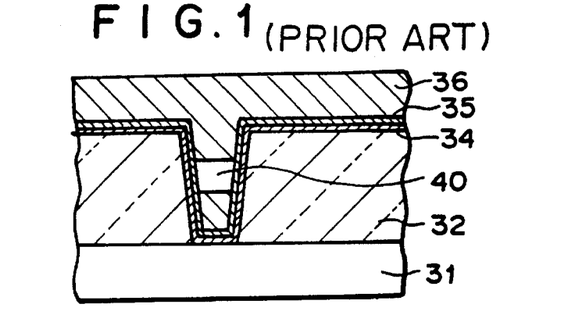
FIG. 1 is a cross-sectional view for explaining a conventional method of manufacturing a semiconductor device.

However, in any of the methods, it is difficult to fill the viahole with the aluminum alloy film if one side of the viahole is smaller than the depth thereof. It is found so far that it is advisable to provide a titanium nitride layer below the aluminum alloy film in order to make it easy to fluidize the aluminum alloy, which is, however, not preferable from the point of reliability because even if the titanium nitride film is used, as shown in FIG. 1, a cavity 40 can result within the viahole. In FIG. 1, reference numerals 31, 32, 34, 35 and 36 denote the silicon substrate, silicon oxide film, titanium film, titanium nitride film and aluminum alloy film, respectively.

We call the depth of the via hole divided by the length of one side thereof the aspect ratio. If the aspect ratio is more than 1, it is difficult to fill the via hole if any one of the foregoing three methods is used. In particular, with a fine viahole with one side of below 0.5 µm, the cavity within the viahole is likely to occur. Therefore, a fine viahole with one side of below 0.5 µm and the depth above 1.0 µm cannot be filled even if any one of the three methods is used.

It has been widely practiced to embed tungsten or the like deposited by the chemical vapor deposition method into the fine viahole. There are mainly two methods of embedding the tungsten grown by the chemical vapor deposition method. One of them is a method in which the tungsten is grown only on the metallic film or semiconductor without making the tungsten film grow on the insulating film, which is called a selective tungsten growth method. Another one is a method in which after the tungsten film is entirely grown on the surface of the wafer it is entirely etched to remove the tungsten film at the flat portion to leave the tungsten only within the viahole. This method is called a blanket tungsten growth method. Since the examples of embedding the tungsten formed according to these chemical vapor deposition methods are numerously reported so far, they are not specifically cited here. Apart from these methods, in which the tungsten is embedded into the viahole provided in the interlayer insulating film, another new method is recently reported, which is described in, for example, Proceedings of the 38th Spring Applied Physics Association 1991, page 692, 30p-W-9,10,11. This one is a method in which, after a titanium film formed according to the normal sputtering method is patterned so as to remain only within the viahole and therearound, the titanium is irradiated with a laser beam within a vacuum to melt or fluidize the titanium for embedding within the hole.

However, even if any one of these methods is used, it is difficult to make identical all the heights of the surfaces of the high melting point metal embedded within the viahole.

Figure 2:
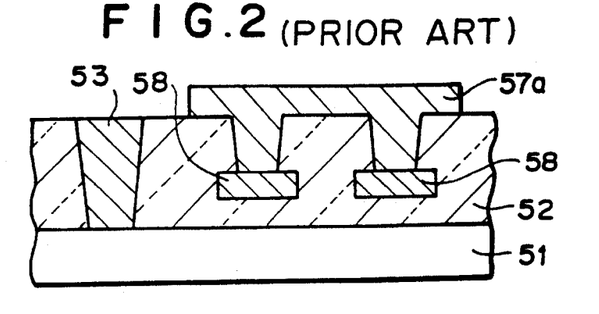
FIG. 2 is a cross-sectional view for explaining a conventional method of manufacturing a semiconductor device.

That is, in the selective tungsten growth method, since the depths of all the viaholes are not identical in a single semiconductor device, if, as shown in the left half of FIG. 2, the tungsten 53 is made to grow so as to match the deep viahole, then it shorts at the adjacent shallow viaholes which are shown in the right half of FIG. 2, in which 57a denotes tungsten film, and if it is matched with the shallow viahole, then the deep viahole cannot completely be filled. In FIG. 2, reference numerals 51, 52 and 58 denote the silicon substrate, silicon oxide film and poly-crystalline silicon film, respectively.

Further, even if all the depths of the viahole are identical and one tries to completely fill the via hole for flattening, because of the existing distribution of the growing film thickness, the tungsten is grown with a spill over from the viahole, so that it can often be shorted between the viaholes. Still further, if one tries to fill the entire depth of the viahole by the selective growth of the tungsten film, then, because of the increase growth time of the tungsten film, a selective performance is degraded and the tungsten film tends to grow also on the interlayer insulating film. If the tungsten film has grown on the interlayer insulating film, when a wiring is formed thereon with the aluminum alloy film, the wired lines can be shorted by the tungsten film.

Further, if the viahole is filled according to the blanket tungsten growth method, when the tungsten film is entirely etched to remove the tungsten film at the flat portion, it is difficult to stop etching at the same time as the tungsten film is eliminated at the flat portion, and even if one tries to do so, it is impossible to eliminate the remainder of the tungsten over the entire surface of the wafer. Thus some over-etching becomes necessary to eliminate the remainder, which, however, also entails the etching of the tungsten within the viahole with the result that the viahole cannot entirely be filled.

Further, according to the method of embedding the titanium into the via hole, only when the sum of the volumes of the titanium film deposited within the viahole and of the titanium film therearound is completely the same as that of the viahole, the heights of surfaces of the interlayer insulating film and of the embedded titanium become identical, but the depth or size of the viahole differs depending on the kind of the substrate or the location where it is positioned. In other words, since the volumes of the viaholes differ and the volume of the patterned titanium film differs depending on the location where it is positioned, it is impossible to fill the entire viahole completely.

As described above, the conventional methods of forming the metallic film at the viahole for interconnecting the upper layer wiring to the lower layer wiring or the electrically conductive area of the semiconductor substrate cannot be free of some drawbacks.

That is, the method of filling the viahole with the aluminum alloy takes little effect with the fine viahole with a large aspect ratio and the method of filling the viahole with the high melting point metal presents the following problems.

Figure 3:
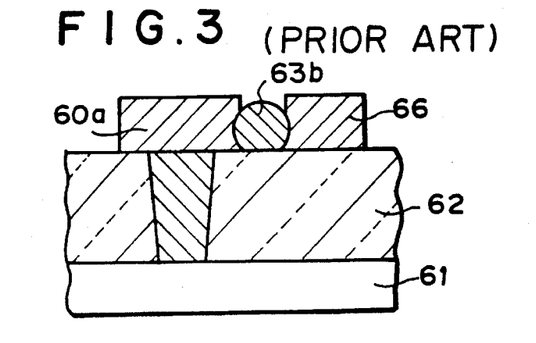
FIG. 3 is a cross-sectional view for explaining a conventional method of manufacturing a semiconductor device.

First, it is difficult to embed the high melting point metal into the viahole completely, and even if one tries to do so, depending on the kind of the viahole, the metal can spill over from the hole due to the distribution of the thickness of the metal film or of the depth of the viahole, or the metal can remain on the interlayer insulating film. Therefore, if the metallic wiring is to be formed thereon with, for example, the aluminum alloy film, the wired lines can be shorted by the high melting point metal film (57a in FIG. 2) which has spilled over or the metal (63b in FIG. 3) remaining on the interlayer insulating silicon oxide film 62. In FIG. 3, reference numerals 61, 60a and 66 denote the silicon substrate, aluminum alloy film and aluminum alloy film, respectively.

Figure 4:
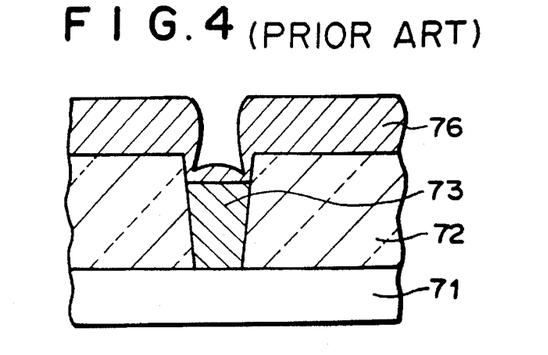
FIG. 4 is a cross-sectional view for explaining a conventional method of manufacturing a semiconductor device.

On the contrary, it often happens that the thickness of the metal film within the viahole is small and that it is depressed over the surface of the insulating film. In this case, if the size of the via hole becomes fine to below 0.5 μm×0.5 μm, when the aluminum alloy film or the like, which is the metal for wiring, is formed thereon according to the sputtering method, even if the viahole depression is on the order of 0.2 through 0.3 μm, as shown in FIG. 4, the step coverage is extremely degraded leading to the wire disconnection, and, otherwise, causing various problems from the point of reliability. In FIG. 4, reference numerals 71, 72, 73 and 76 denote the silicon substrate, silicon oxide film, tungsten film and aluminum alloy film, respectively.

SUMMARY OF THE INVENTION

Accordingly, an object of the present invention is to provide a method of manufacturing a semiconductor device which prevents shorting of the metallic wires or the wire disconnection at the viahole.

According to the present invention, there is provided a method of manufacturing a semiconductor device comprising the steps of: forming a hole at an interlayer insulating film on a semiconductor substrate so as to reach a lower layer wiring or the semiconductor substrate; embedding a first electrically conductive material into the hole to form a first electrically conductive layer so as to make the upper surface of the first electrically conductive layer lower than the upper surface of the insulating film; and then embedding a second electrically conductive material having a melting point lower than the first electrically conductive material into the hole to form a second electrically conductive layer on the first electrically conductive layer, thereby the hole becomes completely filled with the first and second electrically conductive layers.

In the present invention; the semiconductor substrate may be made from silicon; the insulating film may be made from silicon oxide, phosphorous silicate glass or boron phosphorous silicate glass; the lower layer wiring may be made from polycrystalline silicon, aluminum alloy, refractory metal or refractory metal silicide; the first electrically conductive material may be tungsten, titanium, molybdenum, nickel or titanium nitride; and the second electrically conductive material may be aluminum alloy or copper.

In one embodiment of the present invention, the size of the hole measured along the surface of the insulating film is within the range of greater than 0.05 μm and smaller than 0.5 μm and the difference in height between the upper surface of the insulating film and the upper surface of the first electrically conductive layer is smaller than the size of the hole.

In another embodiment of the present invention, the first electrically conductive material is embedded by selectively growing on the lower layer wiring or semiconductor substrate exposed at the hole by a chemical vapor deposition method.

According to the present invention, there is provided the above-mentioned method of manufacturing a semiconductor device, wherein, especially, the first electrically conductive material is embedded by the steps of forming a film of the first electrically conductive material in the hole and on the insulating film and then removing the first electrically conductive material on the insulating film and of the upper portion of the film in the hole to leave the material of the lower portion of the film in the hole. Here; the film of the first electrically conductive material may be formed by a chemical vapor deposition method; and an underlayer may be formed prior to forming of the film of the first electrically conductive material, wherein the underlayer may comprise a titanium film and a titanium nitride film formed on the titanium film, a tungsten film or a titanium-tungsten (TiW) film.

According to the present invention, there is provided the above-mentioned method of manufacturing a semiconductor device, wherein, especially, the first electrically conductive material is embedded by the steps of forming a film of the first electrically conductive material in the hole and on the insulating film so as not to completely fill the hole, removing the first electrically conductive material on the insulating film at an area other than around the hole and then heating the remaining first electrically conductive material for fluidization to move the material on the insulating film into the hole. Here; the film of the first electrically conductive material may be formed by a sputtering method; and the film of the first electrically conductive material may be heated by irradiating with laser beam.

According to the present invention, there is provided the above-mentioned method of manufacturing a semiconductor device, wherein, especially, the second electrically conductive material is embedded by forming a film of the second electrically conductive material while the semiconductor substrate is heated to, at maximally, a sufficiently high temperature to fluidize the film of the second electrically conductive material. Here, the heating temperature of the semiconductor substrate may be in the range of 400 through 550 degrees Centigrade; and the film of the second electrically conductive material may be formed by a sputtering method.

According to the present invention, there is provided the above-mentioned method of manufacturing a semiconductor device, wherein, especially, the second electrically conductive material is embedded by forming a film of the second electrically conductive material and then heating the semiconductor substrate to a sufficiently high temperature to fluidize the film of the second electrically conductive material. Here, the heating temperature of the substrate or the film of the second electrically conductive material may be 450 through 600 degrees Centigrade; the film of the second electrically conductive material may be formed by a sputtering method; and the film of the second electrically conductive material may be heated by irradiating with laser beam.

According to the present invention, there is provided a method of manufacturing a semiconductor device comprises a process in which, although the viahole provided in the interlayer insulating film is filled with the high melting point metal, the upper surface of this metal is made lower than the surface of the interlayer insulating film and, when the aluminum alloy film, which is the wiring metal, is formed thereon by the sputtering method, the semiconductor substrate is heated to a high temperature to thereby fluidize the aluminum alloy to embed into the viahole.

Further, according to the present invention, there is also provided a method of manufacturing a semiconductor device comprises a process in which, the upper surface of the high melting point metal which is to be embedded into the viahole is formed lower than the surface of the interlayer insulating film and, after the aluminum alloy film is formed thereon by the normal sputtering method, the aluminum alloy film is heated to fluidize to be embedded into the viahole.

According to the present invention, in order to embed the high melting point metal into the viahole, one may use a method of selectively growing the tungsten film on a silicon or metallic film exposed within the viahole according to the chemical vapor deposition method, a method of entirely etching the tungsten film grown on the entire surface according to the chemical vapor deposition method to leave the tungsten only within the viahole, or a method of, after forming the titanium film according to the sputtering method, removing the titanium film outside of the viahole and therearound to irradiate with a laser beam to melt or fluidize the titanium for embedding into the viahole.

Further, according to the present invention, if one side of the viahole which is provided through the interlayer insulating film is below 0.5 μm, the difference in height between the surface of the interlayer insulating film and the upper surface of the high melting point metal is preferably set smaller than the length of one side of the viahole.

According to the present invention, there is provided a semiconductor device which prevents shorting of the metallic wires or the wire disconnection at the viahole.

In the method of manufacturing the semiconductor device according to the present invention, since the first electrically conductive material does not remain on the interlayer insulating film, the wired lines on the insulating film cannot be shorted by the first electrically conductive material, nor is there any disconnection of the wire at the viahole because the viahole is completely filled with the first and second electrically conductive materials, and a high reliable wiring excellent in electromigration-proof performance and stress migration-proof performance can be obtained. Further, since the viahole is filled with the materials so as to flatten the surface, it becomes further easy to form the upper layer wiring.

DESCRIPTION OF THE PREFERRED EMBODIMENTS

Next, the present invention is described with reference to the accompanying drawings, in which FIGS. 5A through 5D are cross-sectional views illustrating in order followed for a first embodiment of the present invention. The selective tungsten growth method is used for embedding the high melting point metal into the viahole, and the following formation of the aluminum alloy film is carried out by the sputtering method. The substrate is heated to a high temperature during the sputtering to fluidize the aluminum alloy.

Figure 5A:
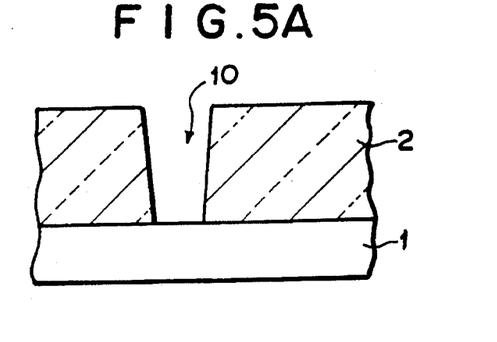
FIGS. 5A through 5D are respectively cross-sectional views illustrating in order the steps followed in accordance with a first embodiment of the present invention.
Figure 5B:
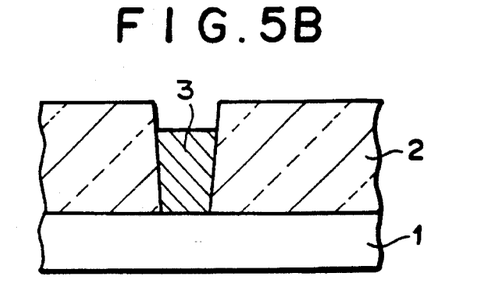
Figure 5C:
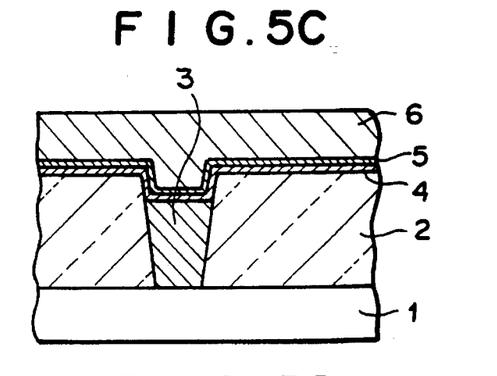
Figure 5D:
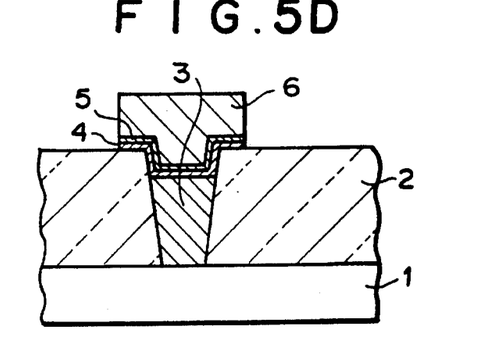

First, after a silicon oxide film 2 is formed as the interlayer insulating film on a silicon substrate 1 on which functional elements (not shown) such as a transistor and the like are formed, a viahole 10 with one side of 0.5 μm which reaches the source/drain areas of the functional element is formed at a desired position of the silicon oxide film 2 (FIG. 5A). Next, a tungsten film or layer 3 is grown shallower by about 0.1 through 0.5 μm than the surface of the silicon oxide film 2 according to the chemical vapor deposition method under a reduced pressure of 10 through 100 mTorr using tungsten hexafluoride ($WF_6$) and silane ($SiH_4$) as the raw materials while the substrate is heated to a temperature of about 250 degrees Centigrade (FIG. 5B). Next, after a titanium film 4 and a titanium nitride film 5 are formed sequentially to the thickness of 10 through 100 nm and 50 through 150 nm respectively according to the sputtering method, the entire silicon substrate 1 is heated to 400 through 550 degrees Centigrade to form an aluminum alloy film 6 to the thickness of 0.4 through 1.5 μm. At this time, the heat resulting from the heated substrate and the impact of plasma during the sputtering cause fluidization of the aluminum alloy to fill the viahole completely (FIG. 5C). When the aluminum alloy film 6 is formed by the sputtering method, after the initial thickness of about 0.1 through 0.3 μm is formed at below 300 degrees Centigrade of the substrate, the remainder is formed by heating to 400 through 550 degrees Centigrade. Although the deposition rate of the aluminum alloy film is often set to about 1.0 μm/min, if this is reduced to below one half, the aluminum alloy film 6 becomes easy to fluidize and can be completely embedded into the viahole. Next, the aluminum alloy film 6, titanium nitride film 5 and titanium film 4 are patterned to a desired form to complete an aluminum alloy electrode wiring embedded into the viahole (FIG. 5D).

In this embodiment, since the bias sputtering is not used, the quality of the aluminum alloy film is superior. Further, in the prior art, when the viahole is filled according to the selective tungsten growth method, it has been necessary to grow the tungsten by the depth of the viahole in order to fill the entire viahole. However, according to the present invention, since the thickness of the grown film may be thinner than the depth of the viahole, a selective performance is hardly degraded and the tungsten has little chance of growing on the interlayer insulating film, nor as spilling over from the viahole, so that the wired lines on the insulating film cannot be shorted by the tungsten. Further, since the aspect ratio of a portion of the hole which remains without being completely filled with the tungsten is below 1, it can be completely filled by the fluidization of the aluminum alloy.

FIGS. 6A through 6F are respectively cross-sectional views illustrating in order the steps followed for in accordance with a second embodiment of the present invention.

In this embodiment, the blanket tungsten growth method is used for filling the viahole and, the aluminum alloy film is formed by the normal sputtering method and then the aluminum alloy is made to fluidize by heating for embedding into the viahole.

Figure 6A:
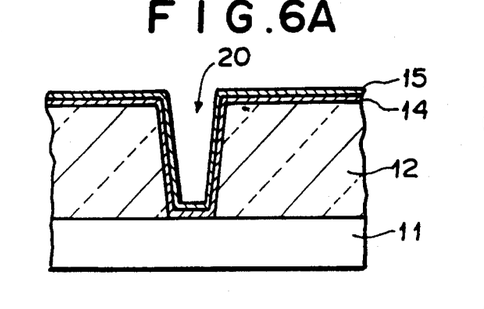
FIGS. 6A through 6F are respectively cross-sectional views illustrating in order the steps followed in accordance with a second embodiment of the present invention.
Figure 6B:
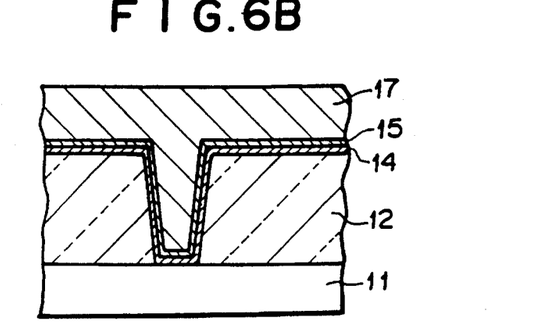
Figure 6C:
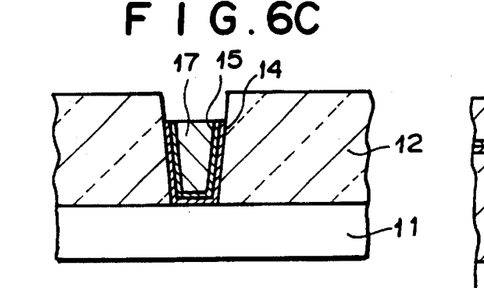

After a desired viahole 20 is formed through a silicon oxide film 12 lying on a silicon substrate 11 as with the first embodiment, a titanium film 14 and a titanium nitride film 15 are sequentially formed to the thickness of 10 through 100 nm and 50 through 200 nm respectively according to the sputtering method (FIG. 6A). Next, a tungsten film 17 is formed to the thickness of 0.4 through 1.0 μm under a reduced pressure of 10 through 100 mTorr at about 400 degrees Centigrade of the substrate temperature using $WF_6$ and hydrogen ($H_2$) as the raw material gases (FIG. 6B). Next, the tungsten film 17 is entirely etched with sulfur hexafluoride ($SF_6$) until the surface of the titanium nitride film 15 is exposed and the tungsten film 17 within the viahole is further etched by 0.1 through 0.5 μm. Subsequently, the etching gas is changed to chlorine ($Cl_2$) to entirely etch the titanium nitride film 15 and the titanium film 14 to expose the surface of the silicon oxide film 12 (FIG. 6C).

Figure 6D:
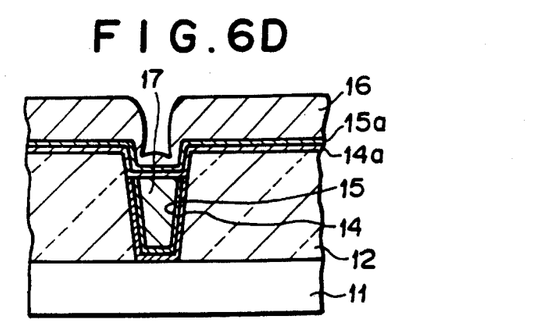
Figure 6E:
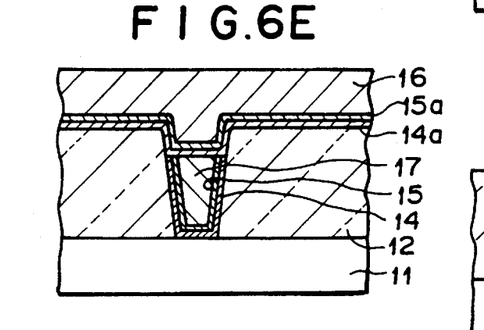

Next, after the titanium film 14a and the titanium nitride film 15a are each formed again to the thickness of 10 through 500 nm and 20 through 500 nm respectively according to the sputtering method, the aluminum alloy film 16 is formed to the thickness of 0.4 through 1.5 μm (FIG. 6D). Thereafter, the entire wafer is heated to 450 through 600 degrees Centigrade during about 1 through 5 minutes without being exposed to the atmosphere, thereby aluminum alloy is fluidized to be completely embedded into the viahole (FIG. 6E). After formed, the aluminum alloy film is preferably heated without being exposed to the atmosphere. This is because, if it is exposed to the atmosphere, a natural oxide film is formed on the surface of the aluminum alloy film and, if heated to a high temperature, the natural oxide film makes the aluminum alloy difficult to fluidize.

Figure 6F:
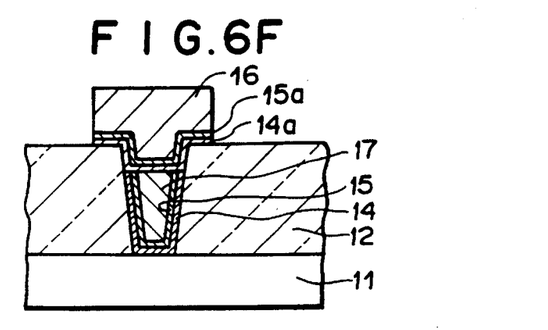

Next, the aluminum alloy film 16, titanium nitride film 15a and titanium film 14a are patterned to complete the aluminum alloy electrode wiring (FIG. 6F).

In the first embodiment, since the heating is under way while the aluminum alloy film is formed by sputtering, the temperature of the film becomes more or less higher than the preset temperature by the impact of the plasma. Therefore, the temperature to which the substrate is heated may be slightly lower than that of the second embodiment in which after the aluminum alloy film is formed it is heated for fluidization.

In the first embodiment, the fluidity of the aluminum alloy is insufficient at the temperature of the substrate below 400 degrees Centigrade and, in the second embodiment, it is also insufficient at the temperature of the substrate below 450 degrees Centigrade. On the other hand, in the first embodiment, the aluminum alloy is completely melted at the temperature of the substrate exceeding 550 degrees Centigrade and, in the second embodiment, it is completely melted at the temperature exceeding 600 degrees Centigrade to often coagulate into particles after cooled. Therefore, in order to fluidize the aluminum alloy by heating the substrate during the sputtering, the range of 400 through 550 degrees Centigrade is preferable while in order to heat the substrate after the sputtering to fluidize the aluminum alloy, the range of 450 through 600 degrees Centigrade is preferable.

Figure 7:
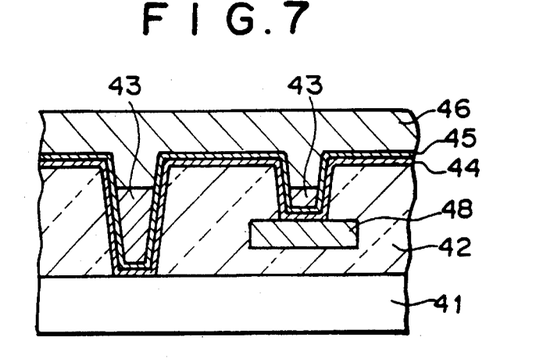
FIG. 7 is a cross-sectional view for explaining the second embodiment.

Further, in the second embodiment, even if the depths of the viaholes differ from each other as shown in FIG. 7, the depths of portion of the viaholes not filled with the remaining blanket tungsten 43 are the same, which offers an advantage that the viaholes of all the depths can similarly be filled and that since the blanket tungsten is overetched it cannot remain on the interlayer insulating film causing a shorting between the wired lines. In FIG. 7, reference numerals 41, 42, 44, 49 and 46 denote the silicon substrate, silicon oxide film, titanium film, titanium nitride film and aluminum alloy film, respectively. Numeral 48 denotes a poly-crystalline silicon film as the lower layer wiring.

An electromigration test was carried out on the device obtained according to the second embodiment of the present invention under the condition of the temperature of 200 degrees Centigrade and the electric current density in the viahole of $6.5 \times 10^6$ A/cm$^2$. For comparison; the test was also carried out on the device obtained according to the conventional method mentioned in the above with reference to FIG. 4 under the same condition. Median time to failure (MTF) for the device of the prior art was 115 hours whereas MTF for the device of the present invention was 344 hours, i.e. approximately three times of that of the prior art.

FIGS. 8A through 8F are respectively cross-sectional views illustrating in order the steps followed for in accordance with a third embodiment of the present invention. In this embodiment, after the viahole is filled in part with titanium, the remainder is filled with the aluminum alloy.

Figure 8A:
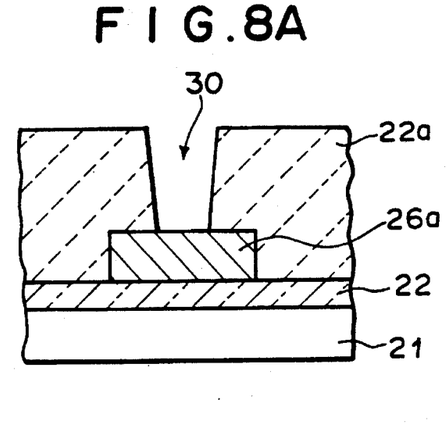
FIGS. 8A through 8F are respectively cross-sectional view of views illustrating in order the steps followed in accordance with third embodiment of the present invention.

First, as the lower layer wiring a first line is formed on the silicon oxide film 22 on the silicon substrate 21 with the aluminum alloy film 26a and then, an interlayer insulating film is formed with a silicon oxide film (plasma oxide film) 22a according to the plasma CVD method, and a viahole 30 reaching the first line is formed at a desired position of the plasma oxide film 22a (FIG. 8A).

Figure 8B:
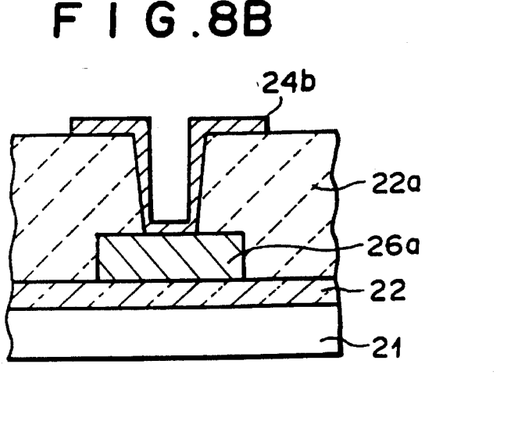

Next, after the titanium film 24b is formed to the thickness of 100 through 300 nm according to the sputtering method, the titanium film is patterned so that it remains only in the viahole and therearound (FIG. 8B). The size of the pattern is determined considering the volume of the viahole and the thickness of the titanium film 24b, wherein the volume of the titanium is set so that it becomes smaller than that of the viahole.

Figure 8C:
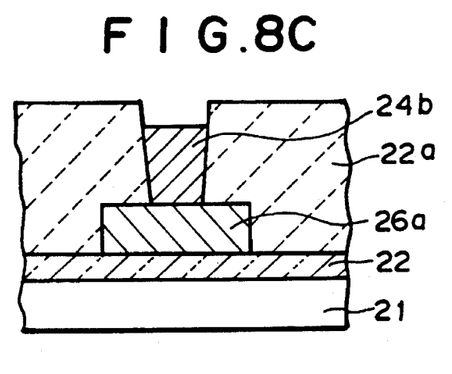

Thereafter, the neighborhood of the wafer surface is irradiated by an focused pulse beam of the XeCl excimer laser. The energy density of the pulse beam may be 0.5 through 1.0 $J/cm^2$, which may be obtained only by irradiating with 20 through 40 ns of the pulse beam only once. However, since the area which can be irradiated once is smaller than the wafer area, it is repeatedly irradiated by offsetting the position. This irradiation of the laser beam causes the titanium film 24b to fluidize to move into the viahole for filling (FIG. 8C).

Figure 8D:
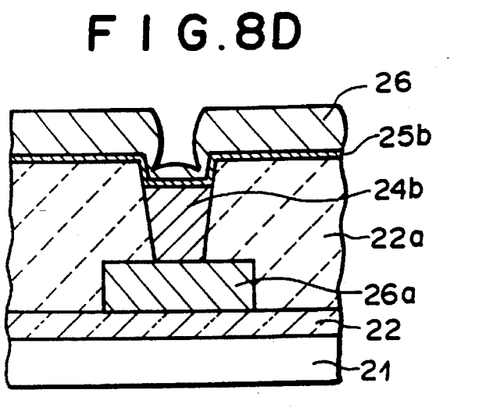

Next, the titanium nitride film 25b and the aluminum alloy film 25 are formed to the thickness of 50 through 150 nm and 0.4 through 1.5 μm respectively according to the sputtering method (FIG. 8D).

Figure 8E:
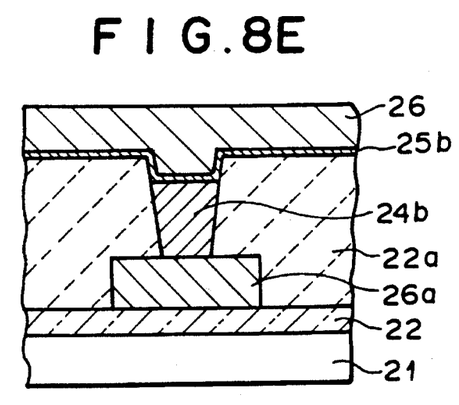

After that, the wafer surface is irradiated with the pulse beam of the XeCl excimer laser. At this time, it is necessary to increase the energy density as compared with the case where the titanium is fluidized, for example, to about 1.5 through 5 $J/cm^2$. Further, although the required irradiation time varies with the thickness of the aluminum alloy film, energy density of the pulse beam, temperature for heating the silicon substrate or the like, it may be about 50 through 300 ns. This irradiation of the laser beam causes the aluminum alloy to fluidize to fill the viahole (FIG. 8E).

Figure 8F:
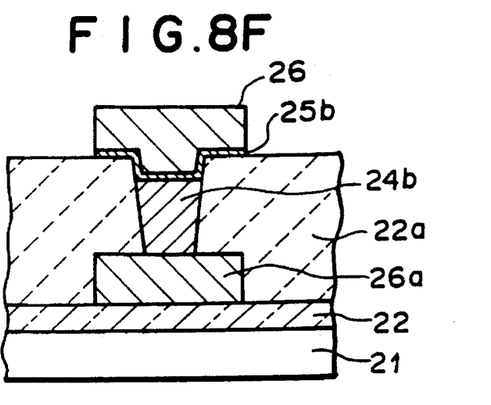

Next, the aluminum alloy film 26 and the titanium nitride film 25b are patterned to a desired form to form a second line to complete an aluminum alloy double layer wiring (FIG. 8F).

Further, when the titanium or aluminum alloy are melted or fluidized by the laser beam irradiation to fill the viahole, it may preferably be carried out within the vacuum so that the surface is not oxidized.

This third embodiment offers an advantage that although the temperature required to fluidize the aluminum alloy for filling the viahole is higher as compared with the first and second embodiments, since the process time is shorter, only a little damage is caused to the elements in the substrate or the lower layer wiring.

As described above, in the method of manufacturing the semiconductor device according to the present invention, when the high melting point metal is embedded into the viahole formed through the interlayer insulating film, the upper surface of the metal is formed lower than the surface of the interlayer insulating film while the remainder is filled by fluidizing the aluminum alloy. As a result, since the high melting point metal does not remain on the interlayer insulating film, the wired lines on the insulating layer cannot be shorted by the high melting point metal, nor is there any disconnection of the wire at the viahole because the viahole is completely filled with the metal, and a high reliable wiring excellent in electro-migration-proof performance and stress migration-proof performance can be obtained. Further, since the viahole is filled with the metal so as to flatten the surface, it becomes easy to form the upper layer wiring.

What is claimed is:

1. A method of manufacturing a semiconductor device comprising the steps of:

forming a hole at an interlayer insulating film on a semiconductor substrate so as to reach a lower layer wiring or the semiconductor substrate, said hole having a depth greater than the size thereof measured along the surface of said insulating film;

embedding a first electrically conductive material into said hole to form a first electrically conductive layer so as to make the upper surface of the first electrically conductive layer lower than the upper surface of said insulating film and to make the difference in height between the upper surface of the insulating film and the upper surface of the first electrically conductive layer smaller than said size of the hole; and then embedding a second electrically conductive material having a melting point lower than said first electrically conductive material into said hole to form a second electrically conductive layer on said first electrically conductive layer, thereby said hole becomes completely filled with the first and second electrically conductive layers while said semiconductor substrate is heated to a sufficiently high temperature to fluidize the second electrically conductive material.

2. A method of manufacturing a semiconductor device as set forth in claim 1 wherein said semiconductor substrate is made from silicon.

3. A method of manufacturing a semiconductor device as set forth in claim 1 wherein said insulating film is made from silicon oxide, phosphorous silicate glass or boron phosphorous silicate glass.

4. A method of manufacturing a semiconductor device as set forth in claim 1 wherein said lower layer wiring is made from poly-crystalline silicon, aluminum alloy, refractory metal or refractory metal silicide.

5. A method of manufacturing a semiconductor device as set forth in claim 1 wherein said first electrically conductive material is tungsten.

6. A method of manufacturing a semiconductor device as set forth in claim 1 wherein said first electrically conductive material is titanium, molybdenum, nickel or titanium nitride.

7. A method of manufacturing a semiconductor device as set forth in claim 1 wherein said second electrically conductive material is aluminum alloy or copper.

8. A method of manufacturing a semiconductor device as set forth in claim 1 wherein the size of said hole is within the range of greater than 0.05 μm and smaller than 0.5 μm.

9. A method of manufacturing a semiconductor device as set forth in claim 1 wherein said first electrically conductive material is embedded by selectively growing on said lower layer wiring or semiconductor substrate exposed at said hole by a chemical vapor deposition method.

10. A method of manufacturing a semiconductor device as set forth in claim 1 wherein said first electrically conductive material is embedded by the steps of forming a film of the first electrically conductive material in said hole and on said insulating film and then removing the first electrically conductive material on the insulating film and of the upper portion of the film in the hole to leave the material of the lower portion of the film in the hole.

11. A method of manufacturing a semiconductor device as set forth in claim 10 wherein said film of the first electrically conductive material is formed by a chemical vapor deposition method.

12. A method of manufacturing a semiconductor device as set forth in claim 10 wherein an underlayer is formed prior to forming of said film of the first electrically conductive material.

13. A method of manufacturing a semiconductor device as set forth in claim 12 wherein said underlayer comprises (a) a titanium film and a titanium nitride film formed on the titanium film, (b) a tungsten film or (c) a titanium-tungsten film.

14. A method of manufacturing a semiconductor device as set forth in claim 1 wherein said first electrically conductive material is embedded by the steps of forming a film of the first electrically conductive material in said hole and on said insulating film so as not to completely fill the hole, removing the first electrically conductive material on the insulating film at an area other than around the hole and then heating the remaining first electrically conductive material for fluidization to move the material on the insulating film into the hole.

15. A method of manufacturing a semiconductor device as set forth in claim 14 wherein said film of the first electrically conductive material is formed by a sputtering method.

16. A method of manufacturing a semiconductor device as set forth in claim 14 wherein said film of the first electrically conductive material is heated by irradiating with laser beam.

17. A method of manufacturing a semiconductor device as set forth in claim 1 wherein the heating temperature of said semiconductor substrate is within the range of 400 through 550 degrees Centigrade.

18. A method of manufacturing a semiconductor device as set forth in claim 1 wherein said film of the second electrically conductive material is formed by a sputtering method.

19. A method of manufacturing a semiconductor device comprising the steps of:

embedding a high melting point metal layer into a hole reaching an electrically conductive element of semiconductor substrate or a lower layer wiring, said hole being provided at an interlayer insulating film lying on the semiconductor substrate and having a depth greater than the size thereof measured along the surface of said insulating film, so as to make the upper surface of said high melting point metal layer lower than the upper surface of said insulating film and to make the difference in height between the Upper surface of the insulating film and the upper surface of the first electrically conductive layer smaller than said size of the hole; and forming an aluminum alloy film by a sputtering method in such a condition that said semiconductor substrate is heated to a sufficiently high temperature to fluidize said aluminum alloy film, thereby said hole becomes completely filled with said high melting point metal layer and said aluminum alloy film.

20. A method of manufacturing a semiconductor device as set forth in claim 19 wherein a length of one side of said hole which is provided in said interlayer insulating film is smaller than 0.5 μm.

21. A method of manufacturing a semiconductor device as set forth in claim 20 wherein the heating temperature of the semiconductor substrate as said aluminum alloy film is formed by the sputtering method is 400 through 550 degrees Centigrade.

22. A method of manufacturing a semiconductor device as set forth in claim 21 wherein said high melting point metal layer is made from tungsten selectively grown on said substrate made from silicon or high melting point metal layer exposed at said hole provided in the interlayer insulating film by a chemical vapor deposition method.

23. A method of manufacturing a semiconductor device as set forth in claim 21 wherein said high melting point metal layer is made from tungsten and formed by leaving a tungsten film only at the hole provided in said interlayer insulating film, said tungsten film being one grown on an entire surface by a chemical vapor deposition method and being left only at the hole by etching the entire surface.

24. A method of manufacturing a semiconductor device as set forth in claim 21 wherein said high melting point metal layer is made from titanium and formed by the steps of forming a titanium film by the sputtering method, removing said titanium film at an area other than around the hole provided in said interlayer insulating film and illuminating the remaining titanium with laser beam to fluidize the remaining titanium to embed into said hole.

25. A method of manufacturing a semiconductor device comprising the steps of:

embedding a high melting point metal layer into a hole reaching an electrically conductive element of semiconductor substrate or a lower layer wiring, said hole being provided at an interlayer insulating film lying on the semiconductor substrate and having a depth of greater than the size thereof measured along the surface of said insulating film, so as to make the upper surface of said high melting point metal layer lower than the upper surface of said insulating film and to make the difference in height between the upper surface of the insulating film and the upper surface of the first electrically conductive layer smaller than said size of the hole;

forming an aluminum alloy film by a sputtering method; and heating said aluminum alloy film to a sufficiently high temperature to fluidize it, thereby said hole becomes completely filled with said high melting point metal layer and said aluminum alloy film.

26. A method of manufacturing a semiconductor device as set forth in claim 25 wherein, subsequent to the sputtering for forming said aluminum alloy film, said aluminium alloy film is heated at the temperature of 450 through 600 degrees Centigrade within the same vacuum unit without being exposed to the atmosphere.

27. A method of manufacturing a semiconductor device as set forth in claim 26 wherein a length of one side of said hole which is provided in said interlayer insulating film is smaller than 0.5 μm and the difference in height between the upper surface of said interlayer insulating film and the upper surface of said high melting point metal layer embedded is smaller than the length of said one side of the hole.

28. A method of manufacturing a semiconductor device as set forth in claim 27 wherein said high melting point metal layer is made from tungsten selectively grown on said substrate made from silicon or high melting point metal layer exposed at said hole provided in the interlayer insulating film by a chemical vapor deposition method.

29. A method of manufacturing a semiconductor device as set forth in claim 27 wherein said high melting point metal layer is made from tungsten and formed by leaving a tungsten film only at the hole provided in said interlayer insulating film, said tungsten film being one grown on an entire surface by a chemical vapor deposition method and being left only at the hole by etching the entire surface.

30. A method of manufacturing a semiconductor device as set forth in claim 27 wherein said high melting point metal layer is made from titanium and formed by the steps of forming a titanium film by the sputtering method, removing said titanium film at an area other than around the hole provided in said interlayer insulating film and illuminating the remaining titanium with laser beam to fluidize the remaining titanium to embed into said hole.

31. A method of manufacturing a semiconductor device as set forth in claim 25 wherein said aluminum alloy film is heated by illuminating with laser beam.

32. A method of manufacturing a semiconductor device as set forth in claim 31 wherein a length of one side of said hole which is provided in said interlayer insulating film is smaller than 0.5 μm.

33. A method of manufacturing a semiconductor device as set forth in claim 32 wherein said high melting point metal layer is made from tungsten selectively grown on said substrate made from silicon or high melting point metal layer exposed at said hole provided in the interlayer insulating film by a chemical vapor deposition method.

34. A method of manufacturing a semiconductor device as set forth in claim 32 wherein said high melting point metal layer is made from tungsten and formed by leaving a tungsten film only at the hole provided in said interlayer insulating film, said tungsten film being one grown on an entire surface by a chemical vapor deposition method and being left only at the hole by etching the entire surface.

35. A method of manufacturing a semiconductor device as set forth in claim 32 wherein said high melting point metal layer is made from titanium and formed by the steps of forming a titanium film by the sputtering method, removing said titanium film at an area other than around the hole provided in said interlayer insulating film and illuminating the remaining titanium with laser beam to fluidize the remaining titanium to embed into said hole.

36. A method of manufacturing a semiconductor device comprising the steps of:

forming a hole at an interlayer insulating film on a semiconductor substrate so as to reach a lower layer wiring or the semiconductor substrate, said hole having a depth of greater than the size thereof measured along the surface of said insulating film;

embedding a first electrically conductive material into said hole to form a first electrically conductive layer so as to make the upper surface of the first electrically conductive layer lower than the upper surface of said insulating film and to make the difference in height between the upper surface of the insulating film and the upper surface of the first electrically conductive layer smaller than said size of the hole;

forming a film of a second electrically conductive material having a melting point lower than said first electrically conductive material; and then heating said semiconductor substrate to a sufficiently high temperature to fluidize the film of the second electrically conductive material to embed the second electrically conductive material into said hole to form a second electrically conductive layer on said first electrically conductive layer, thereby said hole becomes completely filled with the first and second electrically conductive layers.

37. A method of manufacturing a semiconductor device as set forth in claim 36 wherein the heating temperature of said semiconductor substrate is 450 through 600 degrees Centigrade.

38. A method of manufacturing a semiconductor device as set forth in claim 36 wherein said film of the second electrically conductive material is formed by a sputtering method.

39. A method of manufacturing a semiconductor device as set forth in claim 36 wherein said film of the second electrically conductive material is heated by irradiating with laser beam.

* * * * *